US008981205B2

(12) United States Patent
Nowlan

(10) Patent No.: US 8,981,205 B2
(45) Date of Patent: Mar. 17, 2015

(54) PHOTOVOLTAIC MODULE AND METHOD

(75) Inventor: Michael J. Nowlan, Arlington, MA (US)

(73) Assignee: Spire Corporation, Bedford, MA (US)

( * ) Notice: Subject to any disclaimer, the term of this patent is extended or adjusted under 35 U.S.C. 154(b) by 686 days.

(21) Appl. No.: 12/931,233

(22) Filed: Jan. 26, 2011

(65) Prior Publication Data

US 2012/0186629 A1    Jul. 26, 2012

(51) Int. Cl.
*H01L 31/0465* (2014.01)
*H01L 31/048* (2014.01)
*H01L 31/05* (2014.01)

(52) U.S. Cl.
CPC .......... *H01L 31/048* (2013.01); *H01L 31/0516* (2013.01); *Y02E 10/52* (2013.01); *Y10S 136/293* (2013.01)
USPC .......................................... 136/251; 136/293

(58) Field of Classification Search
CPC .............. H01L 31/00; H01L 31/02002; H01L 31/02008; H01L 31/0201; H01L 31/022433; H01L 31/022441
USPC .................................. 136/244, 245, 251, 256
See application file for complete search history.

(56) References Cited

U.S. PATENT DOCUMENTS

| | | | |
|---|---|---|---|
| 5,478,402 A | 12/1995 | Hanoka | |
| 5,951,786 A | 9/1999 | Gee et al. | |
| 6,660,920 B2 | 12/2003 | Osuga | |
| 6,660,930 B1 | 12/2003 | Gonsiorawski | |
| 2003/0000568 A1 | 1/2003 | Gonsiorawski | |
| 2004/0035460 A1 | 2/2004 | Gonsiorawski | |
| 2010/0012172 A1 | 1/2010 | Meakin et al. | |
| 2010/0218800 A1 | 9/2010 | Cousins | |

FOREIGN PATENT DOCUMENTS

| | | |
|---|---|---|
| JP | 2007-5246 | 1/2007 |
| JP | 2007-189132 A | 7/2007 |
| JP | 2010-16074 | 1/2010 |
| JP | 2010-157553 A | 7/2010 |

OTHER PUBLICATIONS

English machine translation of Sainoo (JP 2010-157553) published Jul. 15, 2010.*
Van Kerschaver et al., "Back-Contact Solar Cells: A Review", Progress in Photovoltaics Research and Applications, Prog. Photovolt: Res. Appl. 2006: 14, pp. 107-123.
"AT&S & Solland: prototype production line for photovoltaics", http://www.ats.net/en/ats/news.php?newsnr=221, Feb. 26, 2010, 7 pgs. (unnumbered).
The International Searching Authority, Written Opinion of the International Searching Authority for International Application No. PCT/US2011/001681, 4 pages (unnumbered), Published on Jan. 24, 2012.

\* cited by examiner

*Primary Examiner* — Jonathan Johnson
*Assistant Examiner* — Christina Chern
(74) *Attorney, Agent, or Firm* — Iandiorio Teska & Coleman, LLP

(57) ABSTRACT

A photovoltaic module comprises at least one string of back contact solar cells and a porous non-conductive layer behind the cells including thereon flexible conductive pathways electrically interconnecting the solar cells. There is a back sheet and an encapsulant between the back sheet and the porous non-conductive layer flowable through the porous non-conductive layer and bonding the back sheet to the solar cells.

22 Claims, 3 Drawing Sheets

PHOTOVOLTAIC MODULE AND METHOD

FIELD OF THE INVENTION

The subject invention relates to photovoltaic modules such as solar panels.

BACKGROUND OF THE INVENTION

In a traditional solar panel, solar cells are electrically interconnected in strings using thin flat conductive interconnect "ribbons" or "tabs". The solar cells may be crystalline silicon or thin film solar cells including amorphous silicon, CIGS, and CdTe. The ribbons are typically thin copper strands that may be coated with a tin or solder alloy such as tin-silver, tin-lead, tin-lead-silver, or bismuth-tin.

In one convention design, the front of the first solar cell in a string is electrically connected to the back of the second solar cell in the string, the front of which is electrically connected to the back of the third solar cell, and so on using pairs of spaced interconnect ribbons soldered to the cells. Strings of solar cells, in turn, are electrically connected by bus ribbons. A typical panel may also include a glass cover sheet and a weather protective back plastic sheet.

Back contact solar cells were engineered to reduce shadowing losses and the like. See Van Kerschaver and Beaucerne, "Back-Contact Solar Cells: A Review", Progress in Photovoltaics: Research and Applications, 2006; 14:107-123 (2005). Solland Solar, for example, offers back contact solar cells called "Sunweb" where the back contacts are in an array. Another back contact design has the contacts in an interdigitated design.

In this way, the back sheet of the panel can include a foil conductive layer to electrically interconnect solar cells in a string.

SUMMARY OF THE INVENTION

But, the cells are also mechanically coupled to the back sheet which can result in wear of the plastic back sheet during thermal cycling of the panel. Wear of the weather resistant plastic back sheet can result in damage to the solar panel. Also, any encapsulant between the back sheet and the solar cells must be patterned so as not to interfere with the electrical connection between the back contacts of the solar cells and the metal foil.

In one aspect, the invention provides a photovoltaic module such as a solar panel which, in one preferred embodiment, includes a back sheet which does not wear during repeated thermal cycles and which allows for full encapsulation of the solar cells for long module service life reducing moisture, condensation, corrosion, and delamination. One preferred method of the subject invention is also amenable to high speed automated processes.

This invention features a photovoltaic module comprising at least one string of back contact solar cells and a porous non-conductive layer behind the cells including thereon flexible conductive pathways electrically interconnecting the solar cells. There is a back sheet and an encapsulant between the back sheet and the porous non-conductive layer flowable through the porous non-conductive layer and bonding the back sheet to the solar cells.

The back contact solar cells may each include an array of contacts, in one version, or the back contact solar cells each can include interdigitated contacts in another exemplary version. Preferably, the porous non-conductive layer includes non-woven fiberglass material.

In one design, the flexible conductive pathways include metal foil adhered to the porous non-conductive layer, the flexible conductive pathways are soldered or adhered to the back contact solar cells, and the back sheet includes an insulated non-porous layer (typically plastic). The encapsulant may include a layer of ethylene vinyl acetate.

The module (e.g., a panel) typically also includes a glass front sheet over the cells and an encapsulant securing the glass front sheet over the cells.

A method of manufacturing a photovoltaic module, in accordance with an example of the invention, includes forming conductive pathways on a porous non-conductive layer, securing back contacts of a string of back contact solar cells to the conductive pathways, and assembling an insulated back sheet with the solar cells together with an encapsulant. The encapsulant is heated so it flows through the porous non-conductive layer bonding the back sheet to the cells.

Solder can be added to the conductive pathways and reflowed. A conductive adhesive can be added to the conductive pathways and cured. Typically, forming includes adhering the conductive pathways to the porous non-conductive layer. Also, a glass front sheet can be added over the cells and an encapsulant is then usually disposed to secure the glass front sheet over the cells.

One photovoltaic module stack, in accordance with this invention, features at least one string of back contact solar cells, a porous non-conductive layer behind the cells including thereon conductive pathways electrically interconnecting said solar cells, a back sheet, a first encapsulant between the back sheet and the porous non-conductive layer, a glass front sheet over the cells, and a second encapsulant between the glass front sheet and the cells.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
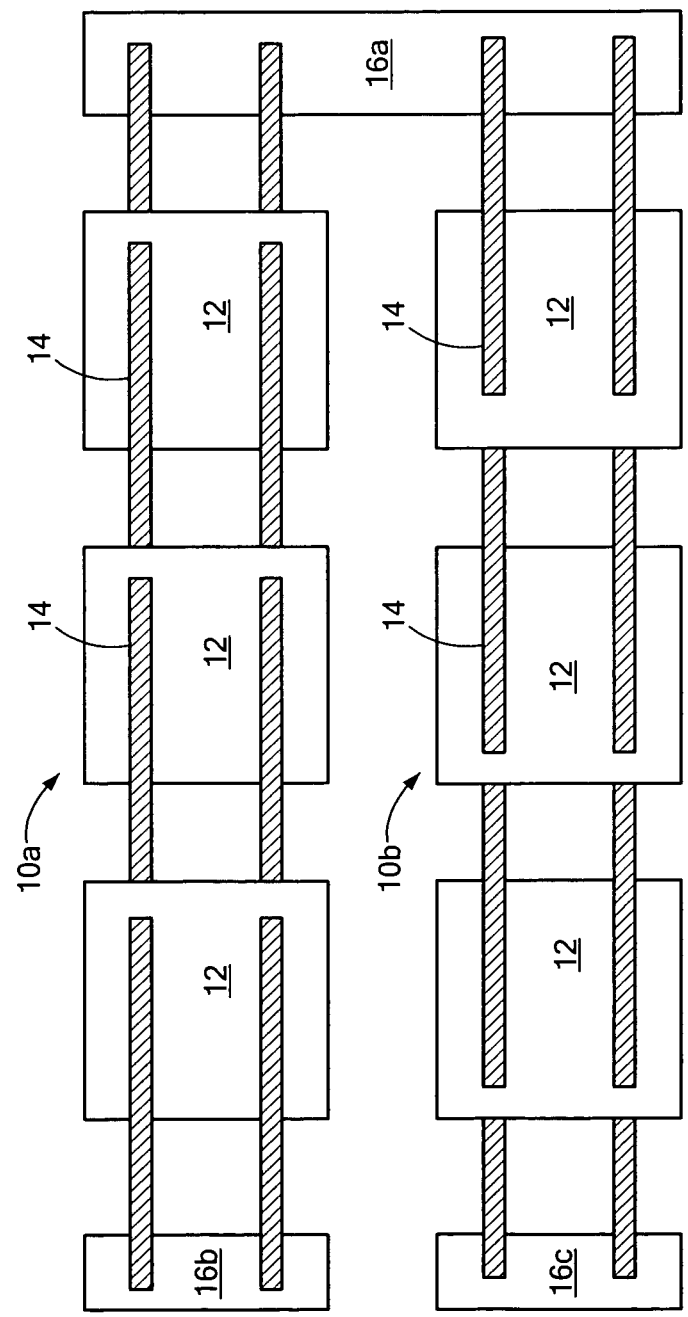
FIG. 1 is a schematic top view showing two strings of solar cells and interconnect ribbons between individual cells of each string in accordance with the prior art.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, one typical solar module includes strings 10a and 10b of solar cells 12. The solar cells in each string are electrically interconnected via interconnect ribbons 14. Strings 10a and 10b, in turn, are electrically interconnected by bus ribbons 16*a*, 16*b*, and 16*c*. A panel, for example, may include six strings each with numerous cells.

Figure 2:
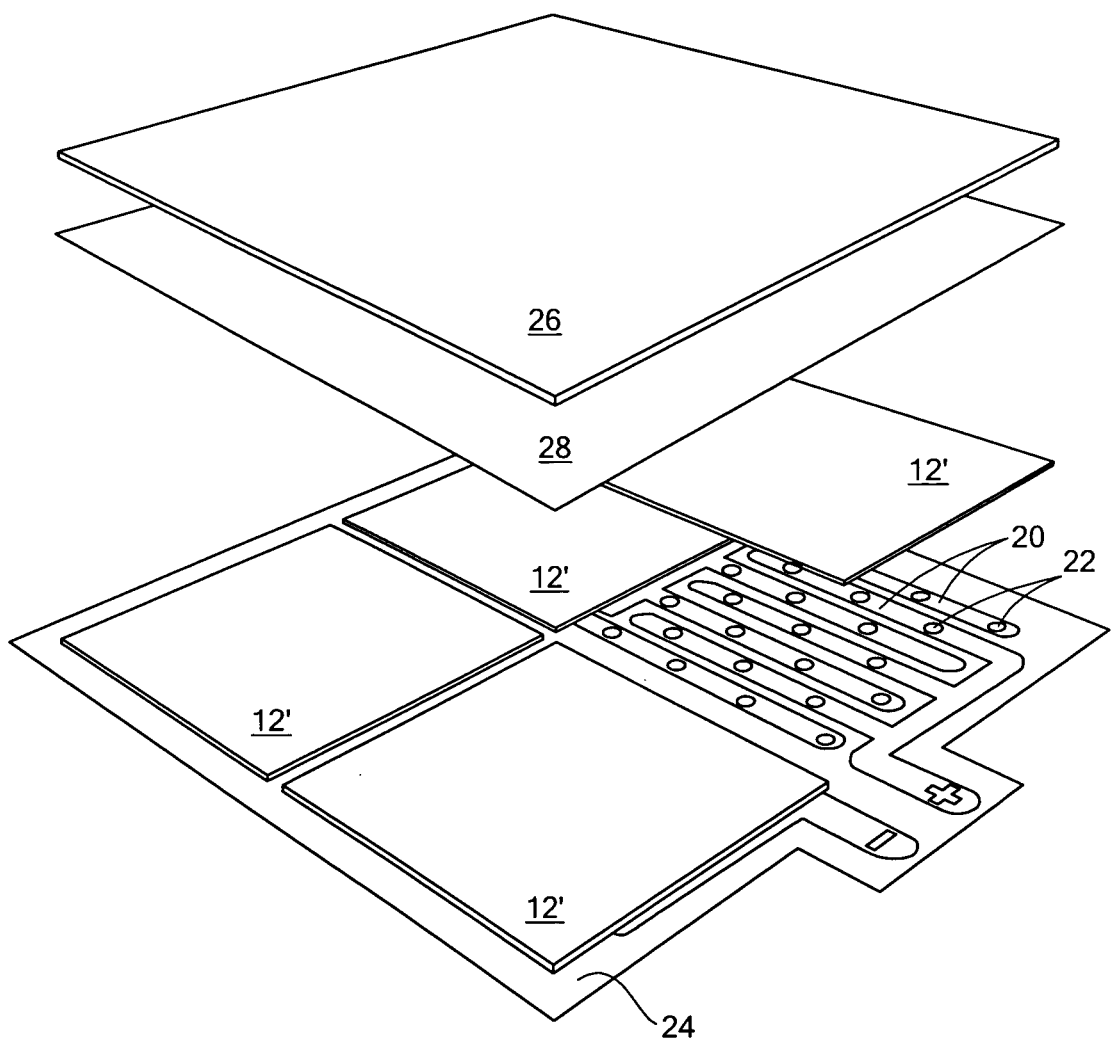
FIG. 2 is a schematic exploded assembly view of one prior art method of interconnecting a specific type of back contact solar cells.

With the advent of back contact solar cells 12', FIG. 2, foil traces 20 including contacts 22 on back weather impervious plastic sheet 24 can be used to electrically connect strings of cells which are then encapsulated between back sheet 24 and glass cover 26 using an encapsulant such as ethylene vinyl acetate layer 28. EVA is also present on weather resistant plastic back sheet 24. The result of this design can be wear of plastic back sheet 24 during thermal cycling of the resulting panel.

Figure 3:
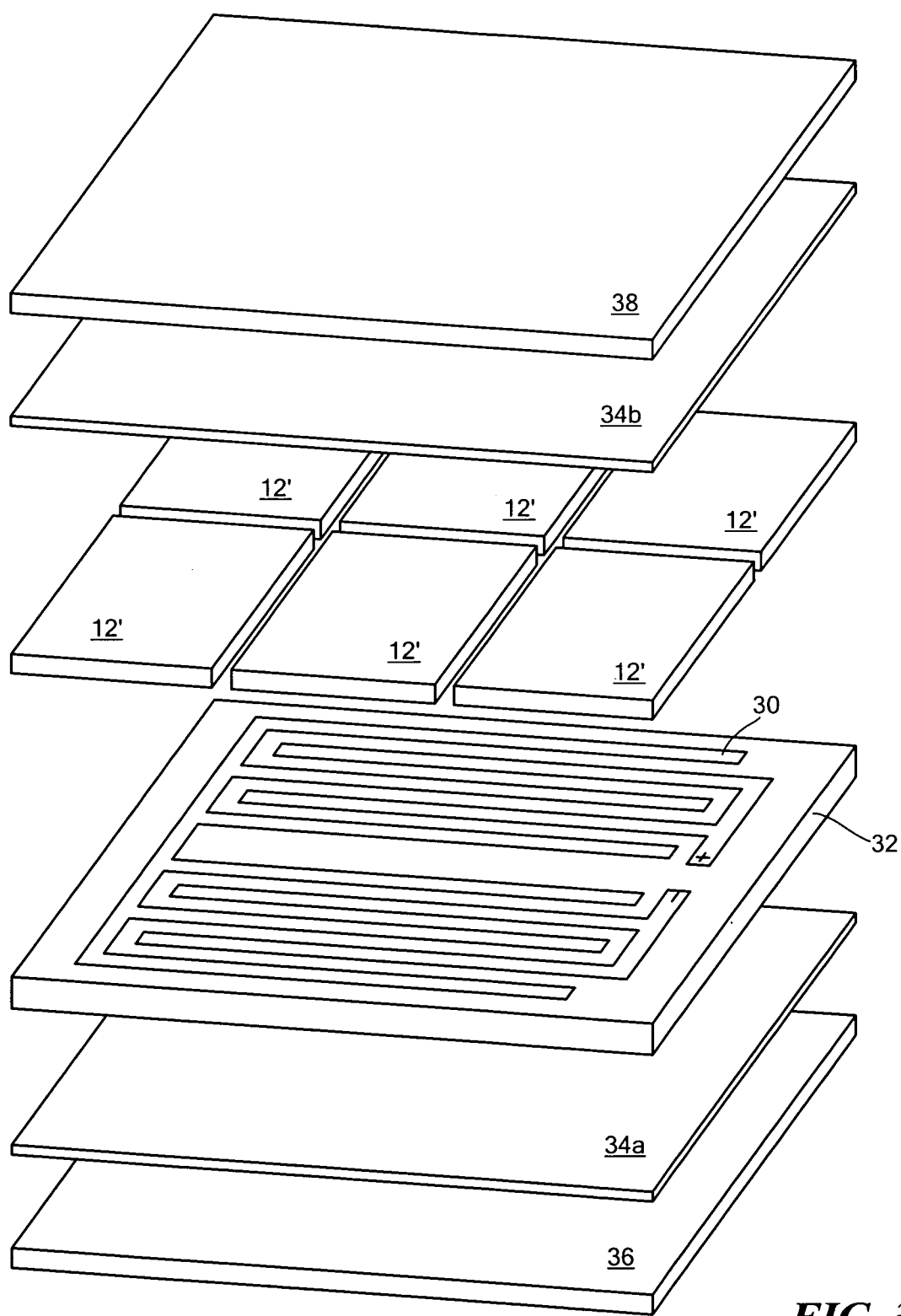
FIG. 3 is a schematic exploded view showing an example of a solar panel in accordance with the invention.

In the subject invention, in contrast, flexible conductive pathways (e.g. metal foil) 30 FIG. 3 are configured depending on the type of back contact cells (12') used to provide the necessary electrical interconnection between each cell 12' and also to electrically connect strings, if desired. Different types of back contact cells can be used including those with an array of contacts as shown in FIG. 2 as well as back contact solar cells with interdigitated contacts as is known in the art. The flexible conductive pathways are supported on porous non-conductive layer 32 (e.g. non-woven fiberglass such as Crane and Co.'s "Craneglas 230"). The porosity of this layer allows encapsulant layer 34*a* to flow through layer 32 securing weather protective insulated impervious plastic back sheet 36 to the back of cells 12'. The metal traces shown at 30 in a variety of different possible patterns can be adhered to porous non-conductive layer 32 using an adhesive and provided in this form in sheets or on a roll. The back contacts of the solar cells, in turn, can be soldered or adhered to the flexible conductive pathways in the appropriate locations. Also provided, in many designs, is glass front sheet 38 over the cells as well as encapsulant layer 34*b* between glass sheet 38 and cell strings 12'. The preferred encapsulant is a sheet of ethylene vinyl acetate or EVA. The porosity of sheet 32 allows encapsulant 34*a* to flow through sheet 32 and bond to the back surfaces of solar cells 12' during the module lamination process. The result is full encapsulation of the solar cells without trapping air or forming non-laminated areas. Full encapsulation results in long module service life since non-laminated areas allow moisture condensation and delamination.

In addition, separating the flexible circuit as shown at 30 from back sheet 36 mechanically decouples cells 12' from back sheet 36 with a layer of low modulus encapsulant 34*a* thereby preventing damage to back sheet 36 during the thousands of thermal cycles over the module lifetime.

The back contact solar cells can be joined to the metal pattern 30 at the desired locations by soldering or with a conductive adhesive. Flexible circuit 30 can be prepared with solder or flux or with a conductive adhesive at the positive and negative joining locations for every cell. High speed automation techniques can be used to pick, inspect, align and place solar cells 12' onto the flexible circuit 30. Heat and pressure can then be applied to re-flow the solder or cure the adhesive. Flexible circuit 30 with the cells attached can be assembled in a stack as shown in FIG. 3 including glass cover sheet 38 and weather protective insulated impervious plastic back sheet 36 and the stack can be vacuum laminated in known module lamination equipment such as the Spi-Laminator available from Spire Corporation, Bedford, Mass.

The use of porous insulating sheet 32 for the flexible circuit 30 allows the solar cells to be bonded to the circuit before an encapsulation layer is applied to the circuit. This allows soldering process to be used for joining the cells to the circuitry without damaging or prematurely melting the encapsulant which can trap air that cannot be removed during lamination. Uncured EVA, for example, has a melting point of 62° C. and is typically cured in a laminator at 150-160° C., well below typical soldering temperatures of 200-240° C.

The flexible circuit can provide for a simpler higher speed module assembly processes. The actual conductors for both cell interconnection and string busing can be provided on flexible circuit 30. The use of porous flexible layer 32 offers several advantages, such as complete cell encapsulation for long module life, decoupling of the cells from the back sheet, and the ability to solder the cells to the circuit without damaging the back encapsulant layer.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A photovoltaic module comprising:
    at least one string of back contact solar cells including backside contacts;
    a porous non-conductive layer behind said cells including incorporated thereon and facing the backside contacts of the solar cells flexible conductive pathways electrically interconnecting the backside contacts of said solar cells;
    a back sheet without any conductive pathways electrically connected to the backside contacts of the solar cells; and
    an encapsulant between the back sheet and the porous non-conductive layer to bond to the back sheet and flowable through the porous non-conductive layer to bond to back surfaces of the solar cells.

2. The module of claim 1 in which the back contact solar cells each include an array of contacts.

3. The module of claim 1 in which the back contact solar cells each include interdigitated contacts.

4. The module of claim 1 in which the porous non-conductive layer includes non-woven fiberglass material.

5. The module of claim 1 in which the flexible conductive pathways include metal foil adhered to the porous non-conductive layer.

6. The module of claim 1 in which the flexible conductive pathways are soldered or adhered to the back contact solar cells.

7. The module of claim 1 in which the back sheet includes an insulated non-porous layer.

8. The module of claim 7 in which the insulated non-porous layer includes plastic.

9. The module of claim 1 in which the encapsulant includes a layer of ethylene vinyl acetate.

10. The module of claim 1 further including a glass front sheet over the cells.

11. The module of claim 10 further including an encapsulant securing the glass front sheet over the cells.

12. A method of manufacturing a photovoltaic module, the method comprising:
   forming and incorporating conductive pathways on a porous non-conductive layer;
   electrically connecting backside contacts of at least one string of back contact solar cells to the conductive pathways on the porous non-conductive layer, such that the conductive pathways on the porous non-conductive layer face the backside contacts of the solar cells;
   assembling an insulated back sheet with the solar cells together with an encapsulant between the back sheet and the porous non-conductive layer; and
   heating the encapsulant so it flows through the porous non-conductive layer bonding to back surfaces of the cells.

13. The method of claim 12 in which securing includes adding solder to the conductive pathways and reflowing the solder.

14. The method of claim 12 in which securing includes adding a conductive adhesive to the conductive pathways and curing the adhesive.

15. The method of claim 12 in which the porous layer contains non-woven fiberglass material.

16. The method of claim 12 in which forming includes adhering the conductive pathways to the porous non-conductive layer.

17. The method of claim 12 further including providing a glass front sheet over the cells.

18. The method of claim 17 further including the step of providing an encapsulant securing the glass front sheet over the cells.

19. A photovoltaic module stack comprising:
   at least one string of back contact solar cells including backside contacts;
   a porous non-conductive layer behind said cells including incorporated thereon and facing the backside contacts of the solar cells conductive pathways electrically interconnecting the backside contacts of said solar cells;
   a back sheet without any conductive pathways electrically connected to the backside contacts of the solar cells;
   a first encapsulant between the back sheet and the porous non-conductive layer bonding to the back sheet and to the solar cells through the porous non-conductive layer;
   a glass front sheet over the cells; and
   a second encapsulant between the glass front sheet and the cells bonding the glass front sheet over the cells.

20. The module stack of claim 19 in which the porous non-conductive layer includes fiberglass material.

21. The module stack of claim 19 in which the conductive pathways include metal foil adhered to the porous non-conductive layer.

22. The module stack of claim 19 in which the conductive pathways are soldered or adhered to the back contact solar cells.

* * * * *